(12) United States Patent
Hirata

(10) Patent No.: US 10,164,625 B2
(45) Date of Patent: Dec. 25, 2018

(54) SEMICONDUCTOR SWITCHING ELEMENT DRIVER CIRCUIT WITH OPERATION BASED ON TEMPERATURE

(71) Applicant: Mitsubishi Electric Corporation, Tokyo (JP)

(72) Inventor: Daisuke Hirata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/638,016

(22) Filed: Jun. 29, 2017

(65) Prior Publication Data
US 2017/0302262 A1 Oct. 19, 2017

Related U.S. Application Data

(62) Division of application No. 15/026,748, filed as application No. PCT/JP2013/080805 on Nov. 14, 2013.

(51) Int. Cl.
*H03K 3/00* (2006.01)
*H03B 1/00* (2006.01)
(Continued)

(52) U.S. Cl.
CPC ... *H03K 17/08128* (2013.01); *H01L 29/1608* (2013.01); *H01L 29/7393* (2013.01);
(Continued)

(58) Field of Classification Search
CPC ....... H03K 17/08128; H03K 17/08122; H03K 17/0822; H03K 2017/0806; H01L 29/7393; H01L 29/1608
See application file for complete search history.

(56) References Cited

U.S. PATENT DOCUMENTS

| 5,036,228 A | * | 7/1991 | Noro | ......................... H03F 1/30 327/108 |
| 6,538,480 B2 | | 3/2003 | Takada et al. | |
| 6,628,491 B1 | | 9/2003 | Tihanyi et al. | |
| 7,157,932 B2 | * | 1/2007 | El-Kik | ............. H03K 19/00369 326/30 |
| 7,652,510 B2 | * | 1/2010 | Izumi | ..................... H03K 17/18 327/108 |

(Continued)

FOREIGN PATENT DOCUMENTS

| JP | H11-326400 A | 11/1999 |
| JP | 2000-083371 A | 3/2000 |

(Continued)

OTHER PUBLICATIONS

International Search Report issued in PCT/JP2013/08085; dated Feb. 10, 2014.
(Continued)

*Primary Examiner* — Kenneth B Wells
(74) *Attorney, Agent, or Firm* — Studebaker & Brackett PC

(57) ABSTRACT

A driver circuit (101) is connected to a control terminal of a semiconductor switching element (1). The driver circuit (101) includes an input circuit (3) connected to an input terminal (50), and an output control circuit (4) connected to the input circuit (3). A pulse signal output from the output control circuit (4) is input to a dead time adjustment circuit (13). The dead time adjustment circuit (13) includes a delay circuit which can delay the rising edge and the falling edge of the pulse signal output from the output control circuit (4) on the basis of signals from temperature analog output circuits (11) and (12). An output from the dead time adjustment circuit (13) is input to the drive circuit (5). The drive circuit (5) outputs a drive signal to an output terminal (51) of the driver circuit (101).

5 Claims, 5 Drawing Sheets

(51) Int. Cl.
*H02H 3/00* (2006.01)
*H03K 17/0812* (2006.01)
*H03K 17/082* (2006.01)
*H01L 29/16* (2006.01)
*H01L 29/739* (2006.01)
*H03K 17/08* (2006.01)

(52) U.S. Cl.
CPC ... *H03K 17/0822* (2013.01); *H03K 17/08122* (2013.01); *H03K 2017/0806* (2013.01)

(56) References Cited

U.S. PATENT DOCUMENTS

| | | | |
|---|---|---|---|
| 7,705,637 B2 | 4/2010 | Ladurner et al. | |
| 8,027,181 B2 | 9/2011 | Hamatani | |
| 8,421,506 B2 * | 4/2013 | Wang | H03K 19/00384 327/108 |
| 9,093,946 B2 | 7/2015 | Kim | |
| 2003/0001630 A1 | 1/2003 | Sakata et al. | |

FOREIGN PATENT DOCUMENTS

| | | |
|---|---|---|
| JP | 2000-299631 A | 10/2000 |
| JP | 2003-087104 A | 3/2003 |
| JP | 2008-277433 A | 11/2008 |
| JP | 2009-136061 A | 6/2009 |
| JP | 2012-253202 A | 12/2012 |
| JP | 2013-219633 A | 10/2013 |

OTHER PUBLICATIONS

Notification of Transmittal of Translation of the International Preliminary Report on Patentability and Translation of Written Opinion of the International Searching Authority; PCT/JP2013/080805 dated May 26, 2016.

The First Office Action issued by the Chinese Patent Office dated Jan. 31, 2018, which corresponds to Chinese Patent Application No. 201380080940.X and is related to U.S. Appl. No. 15/638,016; with English translation.

\* cited by examiner

33: short circuit protection circuit
34: voltage dividing circuit

14: AD conversion circuit
15: Arithmetic circuit
18: Allowable temperature difference setting circuit 14: AD conversion circuit
15: ΔT Arithmetic circuit
19: ΔT Identification circuit 33: short circuit protection circuit
34: voltage dividing circuit

SEMICONDUCTOR SWITCHING ELEMENT DRIVER CIRCUIT WITH OPERATION BASED ON TEMPERATURE

CROSS-REFERENCE TO RELATED APPLICATIONS

The present application is a Divisional Application of U.S. patent application Ser. NO. 15/026,748 filed Apr. 1, 2016.

TECHNICAL FIELD

The present invention relates to a semiconductor switching element driver circuit.

BACKGROUND ART

Various techniques including a technique to limit current supply control on the basis of a temperature detected with a temperature sensor have been proposed to protect switching elements from overheating. A driver circuit which performs overheat protection or the like on the basis of temperature information on a semiconductor switching element, for example, as disclosed in Japanese Patent Laid-Open No. 2009-136061 is known.

PRIOR ART

Patent Literature

Patent Literature 1: Japanese Patent Laid-Open No. 2009-136061
Patent Literature 2: Japanese Patent Laid-Open No. 2008-277433
Patent Literature 3: Japanese Patent Laid-Open No. 2012-253202

SUMMARY OF INVENTION

Technical Problem

In a typical conventional semiconductor device, an overheat protection circuit is provided in a driver circuit to protect a semiconductor switching element from overheating. More specifically, a temperature sensor for temperature detection is provided on the semiconductor switching element. The overheat protection circuit compares the element temperature of the semiconductor switching element with a threshold value on the basis of an output from the temperature sensor, and stops the operation of the driver circuit when the element temperature becomes excessively high. The operation of this overheat protection circuit is to alternatively stop the driver circuit according to whether or not the element temperature has reached the threshold value.

The semiconductor switching element has a temperature characteristic and its input capacitance changes, for example, with the element temperature. Also, when the temperature of an internal portion of the driver circuit for driving the semiconductor switching element is changed, the change in temperature influences the circuit operation. It is preferable that information on the temperature influencing the circuit operation of the driver circuit be reflected more finely in the operation of the driver circuit.

An overheat protection technique using sensing of the temperature of a semiconductor switching element in a single state as described above is well known. In ordinary cases, a semiconductor switching element and a driver circuit for driving the semiconductor switching element have different temperatures during use of a semiconductor device due to the difference between the amounts of heat generated from the semiconductor switching element and the driver circuit, a cooling structure for the semiconductor device, etc. The inventor of the present invention found a technique to perform abnormality detection more finely in a semiconductor device by using this temperature difference.

The present invention has been achieved to solve the above-described problem, and an object of the present invention is to provide a semiconductor switching element driver circuit capable of more finely reflecting temperature information in the operation of the driver circuit.

Means for Solving the Problems

According to the first invention, there is provided a semiconductor switching element driver circuit including an input terminal to which an input signal is input, an output terminal connected to a control terminal of a semiconductor switching element, a signal circuit section which supplies to the output terminal a drive signal having an on edge turned on in response to a rising edge of the input signal, and an off edge turned off in response to a falling edge of the input signal and temperature detection means including at least one of first temperature detection means which outputs a first temperature detection signal having correlation with the temperature of the signal circuit section, and second temperature detection means which receives a second temperature detection signal from an element temperature sensor element which senses the temperature of the semiconductor switching element, wherein at least one of the on edge and the off edge is delayed on the basis of at least one of the first temperature detection signal and the second temperature detection signal so that the difference between an on transmission delay time which is a delay time between the rising edge and the on edge and an off transmission delay time which is a delay time between the falling edge and the off edge is reduced.

According to the second invention, there is provided a semiconductor switching element driver circuit including an input terminal to which an input signal is input, an output terminal connected to a control terminal of a semiconductor switching element, a signal circuit section which produces a drive signal from the input signal and supplies the drive signal to the output terminal, and temperature detection means including at least one of first temperature detection means which outputs a first temperature detection signal having correlation with the temperature of the signal circuit section, and second temperature detection means which receives a second temperature detection signal from an element temperature sensor element which senses the temperature of the semiconductor switching element, wherein the signal circuit section includes a drive circuit which supplies a current to the control terminal of the semiconductor switching element, and wherein the drive circuit changes drive current capability on the basis of at least one of the first temperature detection signal and the second temperature detection signal.

According to the third invention, there is provided a semiconductor switching element driver circuit including an input terminal to which an input signal is input, an output terminal connected to a control terminal of a semiconductor switching element, a signal circuit section which produces a drive signal from the input signal and supplies the drive signal to the output terminal, temperature detection means including at least one of first temperature detection means which outputs a first temperature detection signal having correlation with the temperature of the signal circuit section, and second temperature detection means which receives a second temperature detection signal from an element temperature sensor element which senses the temperature of the semiconductor switching element, a short circuit protection terminal, and a short circuit protection circuit which transmits a stop signal to the signal circuit section when a voltage input to the short circuit protection terminal reaches a threshold value, and which sets the threshold value on the basis of at least one of the first temperature detection signal and the second temperature detection signal.

According to the fourth invention, there is provided a semiconductor switching element driver circuit including an input terminal to which an input signal is input, an output terminal connected to a control terminal of a semiconductor switching element, a signal circuit section which produces a drive signal from the input signal and supplies the drive signal to the output terminal, a temperature detection circuit which outputs a first temperature detection signal having correlation with the temperature of the signal circuit section, a temperature detection terminal which receives a second temperature detection signal from a temperature sensor element for the semiconductor switching element, and an error signal generation circuit which outputs an error signal on the basis of the difference between a temperature indicated by the first temperature detection signal and a temperature indicated by the second temperature detection signal.

Advantageous Effects of Invention

According to the present invention, various operations of the driver circuit are adjusted by using one or both of the first temperature detection signal and the second temperature detection signal, and temperature information can therefore be reflected with accuracy in the operation of the driver circuit.

DESCRIPTION OF EMBODIMENTS

Embodiment 1

Figure 1:
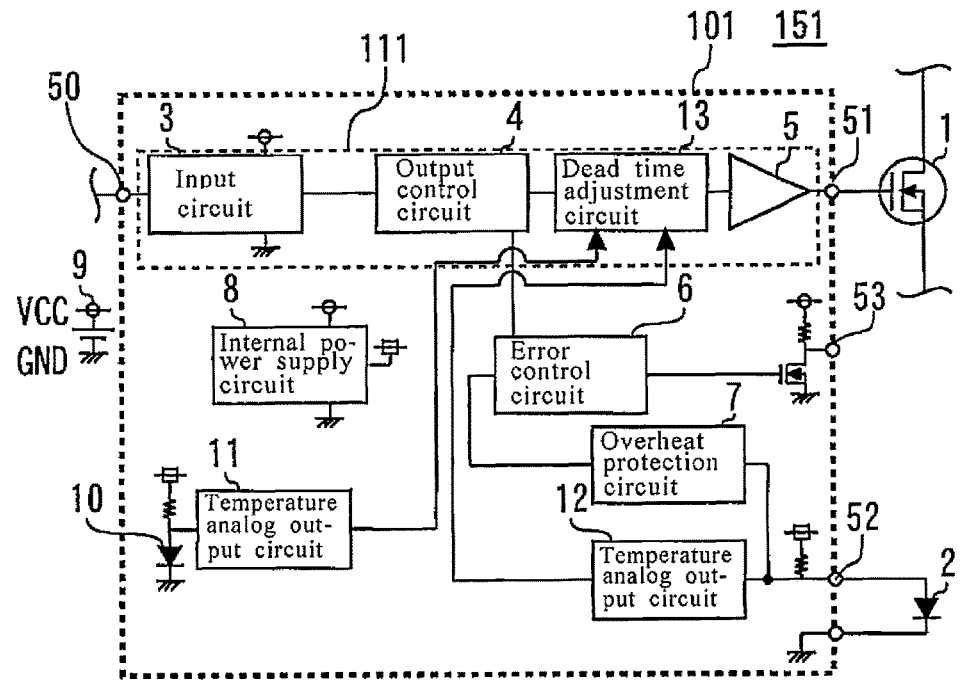
FIG. 1 is a circuit block diagram showing a semiconductor switching element driver circuit according to Embodiment 1 of the present invention.

FIG. 1 is a circuit block diagram showing a semiconductor switching element driver circuit 101 according to Embodiment 1 of the present invention. The driver circuit 101 is connected to a control terminal of a semiconductor switching element 1. The semiconductor switching element 1 according to Embodiment 1 is a MOSFET, and the control terminal is a gate terminal. The driver circuit and the semiconductor switching element 1 constitute a semiconductor device 151 according to Embodiment 1.

The driver circuit 101 includes an input circuit 3 connected to an input terminal 50, and an output control circuit 4 connected to the input circuit 3. A pulse signal output from the output control circuit 4 is input to a dead time adjustment circuit 13. The dead time adjustment circuit 13 includes a delay circuit. This delay circuit can delay a rising edge and a falling edge of the pulse signal output from the output control circuit 4 and thereafter output the pulse signal to a stage subsequent to the dead time adjustment circuit 13.

An output from the dead time adjustment circuit 13 is input to a drive circuit 5. The drive circuit 5 outputs a drive signal to an output terminal 51 of the driver circuit 101. The drive circuit 5 is thus enabled to drive the semiconductor switching element 1.

The input circuit 3, the output control circuit 4, the dead time adjustment circuit 13 and the drive circuit 5 constitute a signal circuit 111 according to Embodiment 1. The signal circuit 111 generates the drive signal from the input signal input to the input terminal 50 and supplies the drive signal to the output terminal 51. The drive signal has an on edge at which it is turned on in response to a rising edge of the input signal, and an off edge at which it is turned off in response to a falling edge of the input signal. The on edge is typically a rising edge for turning on the semiconductor switching element 1. The off edge is typically a falling edge for turning off the semiconductor switching element 1.

The driver circuit 101 includes an error control circuit 6, an overheat protection circuit 7, an internal power supply circuit 8, a temperature sense diode 10, and temperature analog output circuits 11 and 12. The driver circuit 101 has a power supply terminal 9 for obtaining a power supply voltage VCC.

The temperature analog output circuit 12 is connected to a temperature detection terminal 52 of the driver circuit 101. The temperature detection terminal 52 is connected to a temperature sense diode 2 formed on a semiconductor chip on which the semiconductor switching element 1 is formed. The temperature sense diode 2 is capable of monitoring the element temperature of the semiconductor switching element 1.

Each of the temperature sense diode 2 and the temperature sense diode 10 has a forward voltage temperature characteristic. The temperature analog output circuit 11 produces from an output from the temperature sense diode 10 a first analog signal having correlation with the temperature of the driver circuit 101. The temperature analog output circuit 12 produces a second analog signal having correlation with the element temperature of the semiconductor switching element 1 on the basis of an output from the temperature sense diode 2.

When the element temperature of the semiconductor switching element 1 rises above a normal range, the forward voltage of the temperature sense diode 2 becomes equal to or lower than a threshold value set in the overheat protection circuit 7 in advance. In this case, a comparator output signal in the overheat protection circuit 7 is changed and the change in the signal is transmitted to the error control circuit 6.

When the signal from the overheat protection circuit 7 is changed, the error control circuit 6 transmits to the output control circuit 4 a stop signal for stopping drive of the semiconductor switching element 1. The output control circuit 4 receives the stop signal and stops outputting, thus realizing an overheat protection operation. The error control circuit 6 can also output an error signal to the outside through the error signal terminal 53.

The analog signals from the temperature analog output circuits 11 and 12 are input to the dead time adjustment circuit 13.

There is a time delay between transmission of the rising edge of the input signal to the input circuit 3 and actual turning-on of the semiconductor switching element 1 after the transmission of the rising edge. This is also referred to as "on transmission delay time". Similarly, there is a time delay between transmission of the falling edge of the input signal to the input circuit 3 and actual turning-off of the semiconductor element 1 after the transmission of the falling edge. This is also referred to as "off transmission delay time".

If the temperature characteristics of the on-transmission delay time and the off-transmission delay time are different from each other, the difference between the on transmission delay time and the off transmission delay time is changed when a change in temperature occurs. There is a problem that if the difference between the on transmission delay time and the off transmission delay time is increased, dissociation occurs between the on period of the input signal and the on period of the drive signal in correspondence with the difference. The dead time adjustment circuit 13 then adjusts the difference between the on transmission delay time and the off transmission delay time on the basis of temperature information on the semiconductor switching element 1 and temperature information on the driver circuit 101.

More specifically, the dead time adjustment circuit 13 delays at least one of the rising edge and the falling edge of the pulse output from the output control circuit 4 so that the difference between the on transmission delay time and the off transmission delay time is reduced. The edge with a shorter delay may be delayed larger than the edge with a longer delay so that the shorter one of the on transmission delay time and the off transmission delay time becomes equal to the longer one.

The amount of delay when the dead time adjustment circuit 13 (more specifically, a delay circuit incorporated therein) delays the rising edge or the falling edge of the pulse output from the output control circuit 4 is also referred to simply as "delay amount". The difference between the on transmission delay time and the off transmission delay time is reduced, preferably, to zero by setting the delay amount to a suitable value. It is preferable to determine the relationship between the values of the first and second analog signals and the delay amount so that the difference between the on transmission delay time and the off transmission delay time can be maintained at zero or within a predetermined allowable range even when a change in temperature occurs.

Delay amount adjustment is performed by the dead time adjustment circuit 13 adjusting the capacity of the delay circuit therein upon receiving the first analog signal and the second analog signal. The dead time adjustment circuit 13 is designed to change, according to the values of the first analog signal and the second analog signal, in a predetermined proportional relationship, the amount of delay caused by the delay circuit. The relationship between the first analog signal and the delay amount and the relationship between the second analog signal and the delay amount may be determined as described below.

(1) Relationship Between the First Analog Signal and the Delay Amount

The first analog signal has correlation with the temperature of the driver circuit 101. When the temperature of the driver circuit 101 rises, the on transmission delay time and the off transmission delay time are correspondingly increased. If the temperature characteristics of the on transmission delay time and the off transmission delay time are different from each other, an increase in on transmission delay time and an increase in off transmission delay time accompanying a certain rise in temperature of the driver circuit 101 are different from each other. One of the on edge and the off edge corresponding to the smaller increase may be delayed by an amount corresponding to the difference between these increases. Thus, when a change in temperature occurs, changes in on transmission delay time and off transmission delay time can be equalized.

For example, if the increase in off transmission delay time is larger, the edge for turning on the semiconductor switching element 1 (more specifically, the rising edge of the pulse waveform of the input to the drive circuit 5) is delayed by an amount corresponding to the difference between the increase in on transmission delay time and the increase in off transmission delay time when a rise in temperature occurs. A proportional relationship between the temperature of the driver circuit 101 and the delay amount may be determined by examining increases in on transmission delay time and increases in off transmission delay time with respect to increases in temperature of the driver circuit 101 in advance. The "proportional relationship" referred to here is not limited to a proportional relationship defined as monotonous increase or monotonous decrease in accordance with a linear function. The "proportional relationship" referred to here also comprises a relationship in which the delay amount is increased or reduced in accordance with a function of degree two or higher, i.e., curvilinearly, with respect to change in temperature.

(2) Relationship Between the Second Analog Signal and the Delay Amount

The second analog signal has correlation with the element temperature of the semiconductor switching element 1. The on transmission delay time and the off transmission delay time change depending not only on the temperature of the driver circuit 101 but also on the element temperature of the semiconductor switching element 1. The input capacitance has correlation with the element temperature of the semiconductor switching element 1 and has either of a positive temperature characteristic and a negative temperature characteristic.

If the load capacitance, i.e., the input capacitance of the semiconductor switching element 1 in Embodiment 1, is increased, the on transmission delay time and the off transmission delay time are correspondingly increased. The drive circuit 5 has output current capability (source current capability) to charge the input capacitance and output current capability (sink current capability) to discharge the input capacitance. If the source current capability and the sink current capability are not equal to each other, the amount of change in on transmission delay time and the amount of change in off transmission delay time when the input capacitance is changed are different from each other.

Thus, there is a problem that the input capacitance changes when the element temperature is changed, and that the difference between the on transmission delay time and the off transmission delay time varies when the input capacitance changes. More specifically, if the output current capability is reduced, the amount of change in transmission delay time with respect to change in input capacitance is increased. In Embodiment 1, it is assumed that charging ability is higher than the discharging ability, and the delay circuit is controlled as described below.

In a case where the input capacitance has a positive temperature characteristic, that is, the input capacitance increases with a rise in temperature, the delay amount is determined as described below.

First, when the element temperature is increased, the increase in off transmission delay time is larger than the increase in on transmission delay time. The delay circuit in the dead time adjustment circuit 13 then delays the edge for turning on the semiconductor switching element 1 (more specifically, the rising edge of the pulse waveform of the input to the drive circuit 5) by an amount corresponding to the difference between the off transmission delay time and the on transmission delay time.

Conversely, when the element temperature is reduced, the amount of reduction in off transmission delay time is larger than the amount of reduction in on transmission delay time. The delay circuit in the dead time adjustment circuit 13 then delays the edge for turning off the semiconductor switching element 1 (more specifically, the falling edge of the pulse waveform of the input to the drive circuit 5) by an amount corresponding to the difference between the off transmission delay time and the on transmission delay time.

On the other hand, in a case where the input capacitance has a negative temperature characteristic, that is, the input capacitance becomes smaller with a rise in temperature, the delay amount is determined as described below.

First, when the element temperature is increased, the amount of reduction in off transmission delay time is larger than the amount of reduction in on transmission delay time. The delay circuit in the dead time adjustment circuit 13 then delays the edge for turning off the semiconductor switching element 1 (more specifically, the falling edge of the pulse waveform of the input to the drive circuit 5) by an amount corresponding to the difference between the off transmission delay time and the on transmission delay time.

Conversely, when the element temperature is reduced, the increase in off transmission delay time is larger than the increase in on transmission delay time. The delay circuit in the dead time adjustment circuit 13 then delays the edge for turning on the semiconductor switching element 1 (more specifically, the rising edge of the pulse waveform of the input to the drive circuit 5) by an amount corresponding to the difference between the off transmission delay time and the on transmission delay time.

The dead time adjustment circuit 13 may be designed by adding together the delay amount described in (1) and the delay amount described in (2) so that the final delay amount and the edge to be delayed are determined in advance and the edge to be delayed is delayed by the determined delay amount.

As described above, the driver circuit 101 inhibits change of the difference between the on transmission delay time and the off transmission delay time of the driver circuit 101 by using both of the first analog signal and the second analog signal. Since the semiconductor switching element 1 and the driver circuit 101 respectively have temperature characteristics, the circuit operation of the entire semiconductor device 151 can be made appropriate by using information on the temperatures of the semiconductor switching element 1 and the driver circuit 101.

In Embodiment 1, the dead time adjustment circuit 13 is controlled on the basis of both of the first analog signal and the second analog signal. However, the present invention is not limited to this.

Only the first analog signal may be input to the dead time adjustment circuit 13. In such a case, only correction of the delay amount according to the above-described "(1) Relationship between the first analog signal and the delay amount" may be made. In such a case, the circuit relating to the second analog signal (i.e., the temperature analog output circuit 12) may be removed.

The dead time adjustment circuit 13 may alternatively controlled by using only the second analog signal. In such a case, only correction of the delay amount according to the above-described "(2) Relationship between the second analog signal and the delay amount" may be made. In such a case, the temperature sense diode 10 and the temperature analog output circuit 11 may be removed.

Embodiment 2

Figure 2:
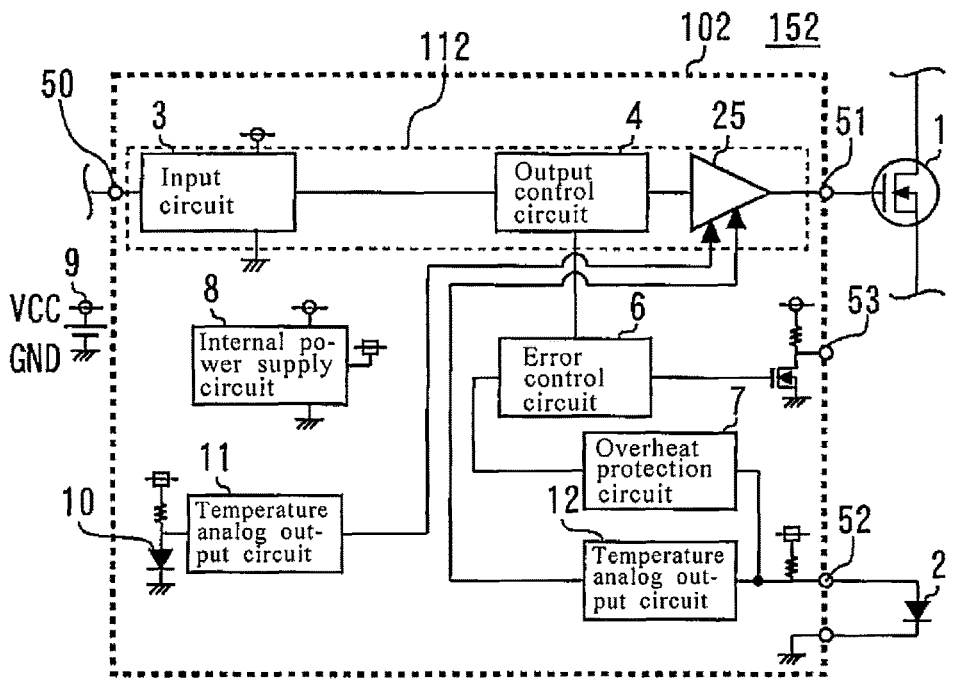
FIG. 2 is a circuit block diagram showing a semiconductor switching element driver circuit according to Embodiment 2 of the present invention.

FIG. 2 is a circuit block diagram showing a semiconductor switching element driver circuit 102 according to Embodiment 2 of the present invention. A driver circuit 102 and a signal circuit 112 have a drive circuit 25 in place of the drive circuit 5, and the dead time adjustment circuit 13 is not provided therein. In other respects, the driver circuit 102 and the signal circuit 112 have the same circuit configurations as those of the driver circuit 101 and the signal circuit 111. The driver circuit 102 and the semiconductor switching element 1 constitute a semiconductor device 152 according to Embodiment 2.

The drive circuit 25 has a plurality of output stage transistors, which are connected in parallel so that a plurality of current paths are formed in parallel with each other. If the number of output stage transistors turned on in the plurality of output stage transistors is increased, a larger current can be caused to flow. That is, the drive current capability can be increased.

The drive circuit 25 receives the first analog signal from the temperature analog output circuit 11 and receives the second analog signal from the temperature analog output circuit 12. The drive circuit 25 is designed to turn on a predetermined number of output stage transistors according to the value of the first analog signal and the value of the second analog signal.

In ordinary cases, a drive circuit has a temperature characteristic, typically a negative temperature characteristic with respect to output current. If the drive current capability has a negative temperature characteristic, the drive current capability is reduced when the temperature is high, and the drive current capability is increased when the temperature is low. There is a problem that the switching loss in the semiconductor switching element driven by the drive circuit varies due to such changes in drive current capability.

In this respect, the number of output stage transistors in the drive circuit 25 is increased on the basis of the first analog signal when the temperature of the driver circuit 102 is increased. The drive current capability of the drive circuit 25 is thereby increased when the temperature of the driver circuit 102 rises, thus enabling reducing variation in drive current capability.

As described above with respect to Embodiment 1, the input capacitance of the semiconductor switching element 1 also has a temperature characteristic. It is desirable that when the input capacitance is changed, the drive current capability of the drive circuit 25 be adjusted in response to the change. The drive circuit 25 is therefore designed so that the number of output stage transistors to be turned on is changed in proportion to the element temperature indicated by the second analog signal.

In a case where the input capacitance has a positive temperature characteristic, that is, the input capacitance increases with a rise in temperature, the number of output stage transistors to be turned on is set larger in order that the drive current capability is improved with the rise in element temperature. Conversely, in a case where the input capacitance has a negative temperature characteristic, that is, the input capacitance is reduced with a rise in temperature, the number of output stage transistors to be turned on is set smaller in order that the drive current capability is reduced with the rise in element temperature.

The drive circuit 25 may be designed by determining in advance, with reference to the above-described tendencies, the final number of output stage transistors turned on according to the temperature of the driver circuit 102 indicated by the first analog signal and the element temperature indicated by the second analog signal.

In Embodiment 2 described above, variation in switching loss can be limited by limiting variation in drive current capability of the drive circuit 25 even when a change in temperature occurs. In particular, in Embodiment 2, both of the information on the element temperature of the semiconductor switching element 1 and the information on the temperature of the driver circuit 102 are input to the drive circuit 25 and, therefore, an optimum number of output stage transistors can be turned on by considering both of the temperature characteristic of the input capacitance and the temperature characteristic of the drive current capability.

In Embodiment 2, the drive circuit 25 is controlled on the basis of both of the first analog signal and the second analog signal. However, the present invention is not limited to this.

Only the first analog signal may be input to the drive circuit 25. In such a case, the number of output stage transistors may be increased when the temperature of the driver circuit 102 is increased on the basis of the first analog signal. In such a case, the circuit relating to the second analog signal (i.e., the temperature analog output circuit 12) may be removed.

Only the second analog signal may alternatively be input to the drive circuit 25. In such a case, the number of output stage transistors to be turned on may be changed in proportion to the element temperature indicated by the second analog signal, as described above. In such a case, the temperature sense diode 10 and the temperature analog output circuit 11 may be removed.

Embodiment 3

Figure 3:
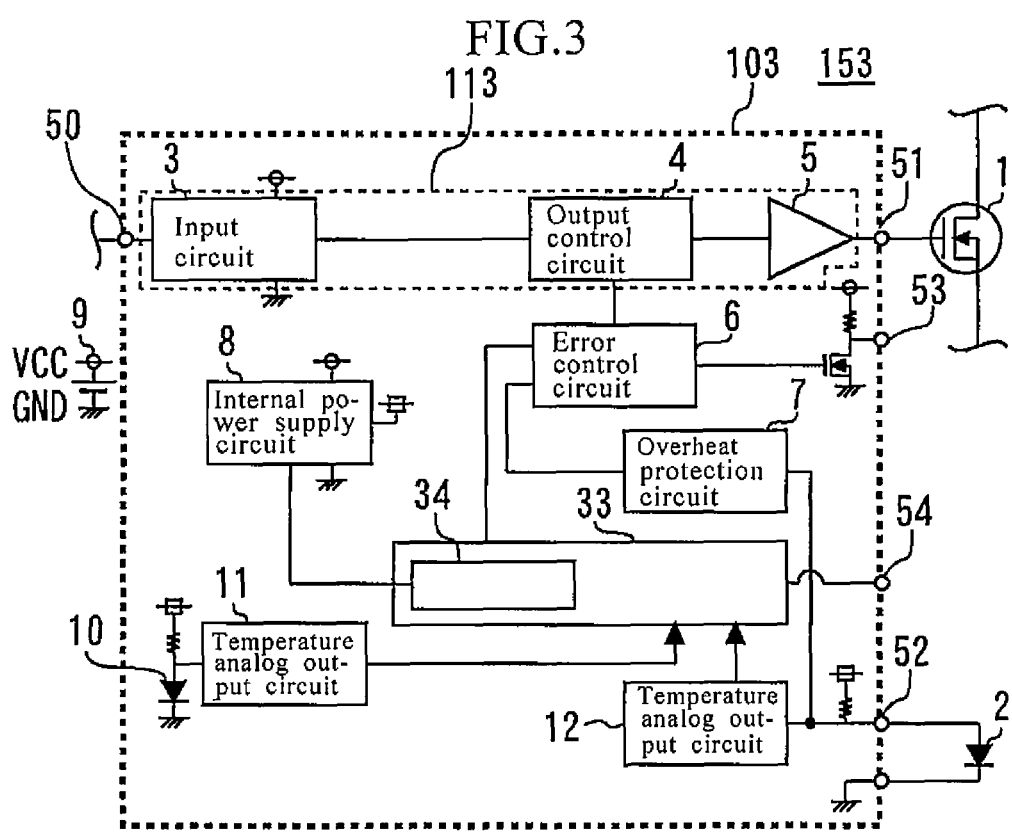
FIG. 3 is a circuit block diagram showing a semiconductor switching element driver circuit according to Embodiment 3 of the present invention.

FIG. 3 is a circuit block diagram showing a semiconductor switching element driver circuit 103 according to Embodiment 3 of the present invention. A driver circuit 103 has a short circuit protection circuit 33, and the dead time adjustment circuit 13 is not provided therein. In other respects, the driver circuit 103 has the same circuit configuration as that of the driver circuit 101. The driver circuit 103 and the semiconductor switching element 1 constitute a semiconductor device 153 according to Embodiment 3. The input circuit 3, the output control circuit 4 and the drive circuit 5 constitute a signal circuit 113 according to Embodiment 3.

The short circuit protection circuit 33 is a circuit for performing a protective operation including stopping the semiconductor switching element 1 when a main current flowing through the semiconductor switching element 1 exceeds a certain level. As a method of detecting the main current flowing through the semiconductor switching element, a method of causing part of the main current to diverge into a current detecting element (cell) connected in parallel with the switching element and detecting the diverging current (sense current), which method is not illustrated, is known. This sense current is converted into a voltage (sense voltage) by using, for example, a resistor to be input to the short circuit protection circuit 33 through a short circuit protection terminal 54. When the sense voltage input through the short circuit protection terminal 54 exceeds a predetermined threshold voltage, the short circuit protection circuit 33 determines that an excess current has flowed through the semiconductor switching element 1, and performs the protective operation.

Also in the driver circuit 103, temperature information on the semiconductor switching element 1 and temperature information on the driver circuit 103 can be obtained by means of the first and second analog signals from the temperature analog output circuits 11 and 12. These items of temperature information are input to the short circuit protection circuit 33, and the short circuit protection circuit 33 adjusts the threshold voltage for short circuit protection.

The short circuit protection circuit 33 has as its internal section a voltage dividing circuit 34 for generating the threshold voltage from the internal power supply circuit 8. A voltage dividing resistance value of this voltage dividing circuit 34 is set variably with reference to the values of the first and second analog signals. The threshold voltage is adjusted with reference to the values of the first and second analog signals in accordance with a proportional relationship determined in advance in the circuit design.

The threshold voltage for short circuit protection has a positive temperature characteristic. When the temperature of the driver circuit 103 is increased, the threshold voltage becomes higher. The short circuit capacity of the semiconductor switching element 1 varies with respect to the element temperature, and current capacity becomes smaller when the element temperature is increased. It is, therefore, preferable to perform circuit protection with the lower threshold voltage set lower. Accordingly, it is preferable to variably set the threshold voltage for short circuit protection with reference to these temperatures.

In the present embodiment, to make correction with respect to these temperature characteristics, a correlation is first established between the element temperature indicated by the second analog signal and any set value of the threshold voltage, and the set value of the threshold voltage is computed on the basis of the second analog signal. Simultaneously, an increase in the threshold voltage due to the temperature characteristic of the driver circuit 103 is computed on the basis of the first analog signal. The threshold voltage can be adjusted by changing the resistance voltage dividing ratio in the voltage dividing circuit 34 so that the increase is canceled out. It is preferable that such threshold voltage setting using both of the first and second analog signals be performed in the entire temperature region including low, ordinary and high temperatures.

The short circuit protection circuit 33 is also connected to the error control circuit 6. The error control circuit 6 adjusts the response time before outputting of the error signal to be output to the outside through the error signal terminal 53 according to a signal from the short circuit protection circuit 33. This error signal is a signal output, for example, to another semiconductor switching element and a driver circuit switched in a phase different from the phase in which the semiconductor switching element 1 is switched or to an external microcomputer or the like to urge the external unit to perform a protective operation.

The error signal output response time has a positive temperature characteristic, and the output response time becomes longer when the temperature of the driver circuit 103 is increased. Therefore, short circuit breakdown of the semiconductor switching element 1 can occur easily even when the threshold voltage is constant. To compensate for this temperature characteristic, an increase in the output response time caused by a rise in temperature is reduced by computing the maximum temperature of the driver circuit 103 estimated from the first analog signal and the second analog signal and by changing the connection capacity of a delay circuit incorporated in the error control circuit 6 or a delay circuit externally connected to the error control circuit 6. Adjustment with respect to the temperature characteristic of the output response time can thus be performed.

In Embodiment 3 described above, variation in the short circuit protection condition due to a change in temperature of the driver circuit 103 and a change in element temperature can be limited. The short circuit protection condition for the semiconductor device 153 can thus be inhibited from being changed with temperature. In particular, since both of the first and second analog signals are input to the short circuit protection circuit 33 in Embodiment 3, the threshold voltage and the output response time can be optimized by considering both of the element temperature information on the semiconductor switching element 1 and the temperature information on the driver circuit 102.

In Embodiment 3, the threshold voltage and the error signal response time of the short circuit protection circuit 33 can be optimized on the basis of both of the first analog signal and the second analog signal. However, the present invention is not limited to this. Only one of the threshold voltage and the error signal response time of the short circuit protection circuit 33 may be adjusted.

Only the first analog signal may be input to the short circuit protection circuit 33. In such a case, an increase in the threshold voltage due to the temperature characteristic of the driver circuit 103 may be calculated on the basis of the first analog signal and the threshold voltage may be reduced by changing the resistance voltage dividing ratio in the voltage dividing circuit 34 so that the increase is canceled out. In such a case, the circuit relating to the second analog signal (i.e., the temperature analog output circuit 12) may be removed.

Only the second analog signal may alternatively be input to the short circuit protection circuit 33. In such a case, a correlation may be established between the threshold voltage and the element temperature indicated by the second analog signal, and the threshold voltage may be set so that short circuit protection is performed at a lower value of the threshold voltage when the element temperature is increased. In such a case, the temperature sense diode 10 and the temperature analog output circuit 11 may be removed.

Embodiment 4

Figure 4:
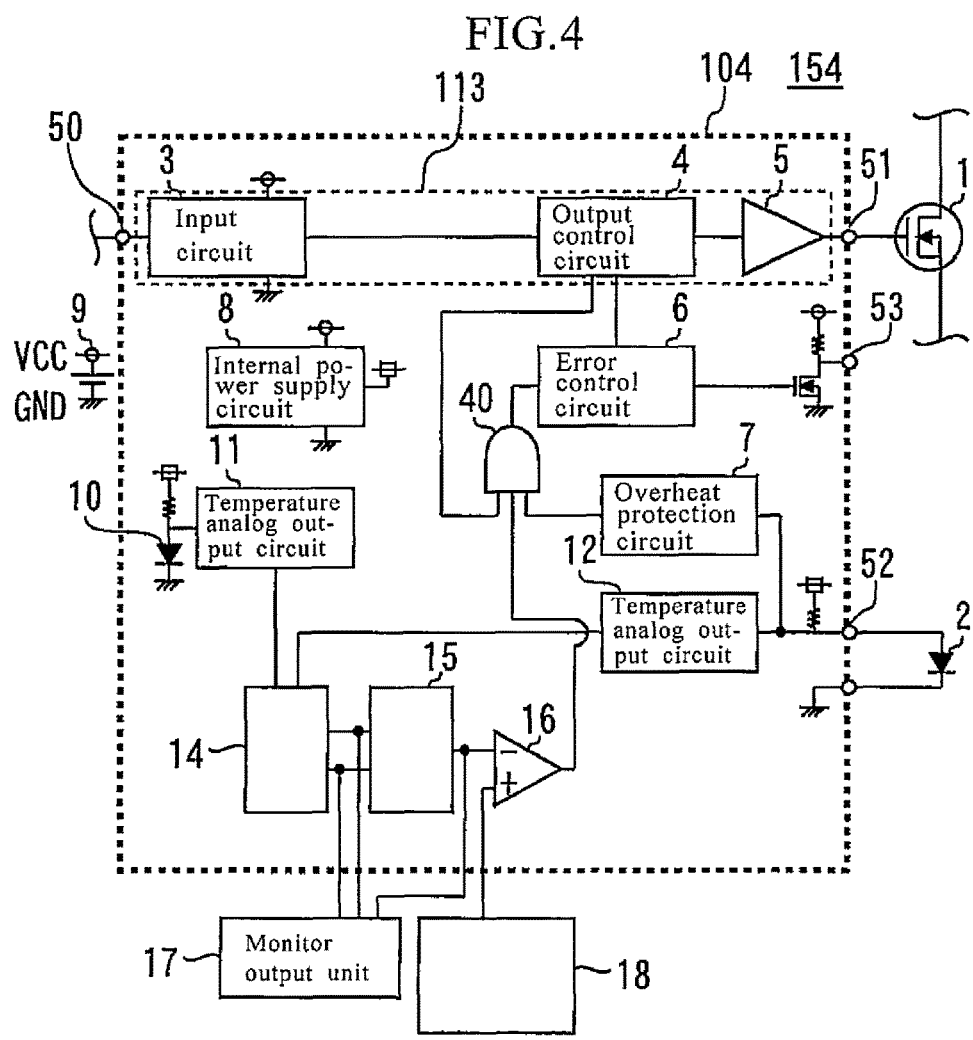
FIG. 4 is a circuit block diagram showing a semiconductor switching element driver circuit according to Embodiment 4 of the present invention.

FIG. 4 is a circuit block diagram showing a semiconductor switching element driver circuit 104 according to Embodiment 4 of the present invention. The driver circuit 104 includes an AD conversion circuit 14, an arithmetic circuit 15, a comparator 16, a monitor output unit 17 and an allowable temperature difference setting circuit 18, and the dead time adjustment circuit 13 is not provided therein. In other respects, the circuit configuration of the driver circuit 104 is the same as that of the driver circuit 101. The driver circuit 104 and the semiconductor switching element 1 constitute a semiconductor device 154 according to Embodiment 4. The driver circuit 104 also includes the signal circuit 113 constituted by the input circuit 3, the output control circuit 4 and the drive circuit 5, as in Embodiment 3.

The AD conversion circuit 14 performs AD conversion of the first analog signal and the second analog signal obtained by the temperature analog output circuit 11 and the temperature analog output circuit 12. The arithmetic circuit 15 computes the difference between the element temperature of the semiconductor switching element 1 and the temperature of the driver circuit 104 expressed as digital values AD-converted by the AD conversion circuit 14 to obtain the difference, i.e., temperature difference ΔT. The comparator 16 outputs an error signal if the temperature difference ΔT input to its negative input terminal becomes smaller than a voltage input to its positive input terminal.

The AD conversion circuit 14 and the arithmetic circuit 15 are connected to a monitor output unit 17 outside the driver circuit 104. The element temperature, the temperature of the driver circuit 104 and the temperature difference ΔT are displayed on the monitor output unit 17 to enable a user to visually recognize these sorts of information. The allowable temperature difference setting circuit 18 can set an allowable value of the temperature difference ΔT as a voltage value to be input to the comparator 16.

The driver circuit 104 includes a three-input AND circuit 40. An output signal from the comparator 16, an output signal from the overheat protection circuit 7 and an output signal from the output control circuit 4 are input to the AND circuit 40. Only when these three input signals are provided, the AND circuit 40 delivers an overheat protection signal to the error control circuit 6. The error signal from the comparator 16 can therefore be masked in a non-high-temperature state or in a state where no input signal is supplied to the input circuit 3 and the driver circuit 104 is not operating.

From computation of the temperature difference ΔT, determination can be made with the comparator 16 as to whether or not a cooling structure for the semiconductor device 154 complies with the design with respect to the element temperature of the semiconductor switching element 1. If the temperature difference ΔT is smaller than the predetermined value, the temperature of the driver circuit 104 is excessively close to the element temperature of the semiconductor switching element 1. The temperature of the driver circuit 104 is ordinarily lower at least to a certain extent than the element temperature. When the temperature difference ΔT is smaller than the predetermined value, therefore, it can be conjectured that the cooling structure has failed to exert the designed cooling performance. In this case, the signal is transmitted from the comparator 16 to the error control circuit 6 and the error signal is output from the error signal terminal 53.

In Embodiment 4 described above, variation of the cooling structure can be detected and information for protecting the semiconductor device 154 can be obtained.

Embodiment 5

Figure 5:
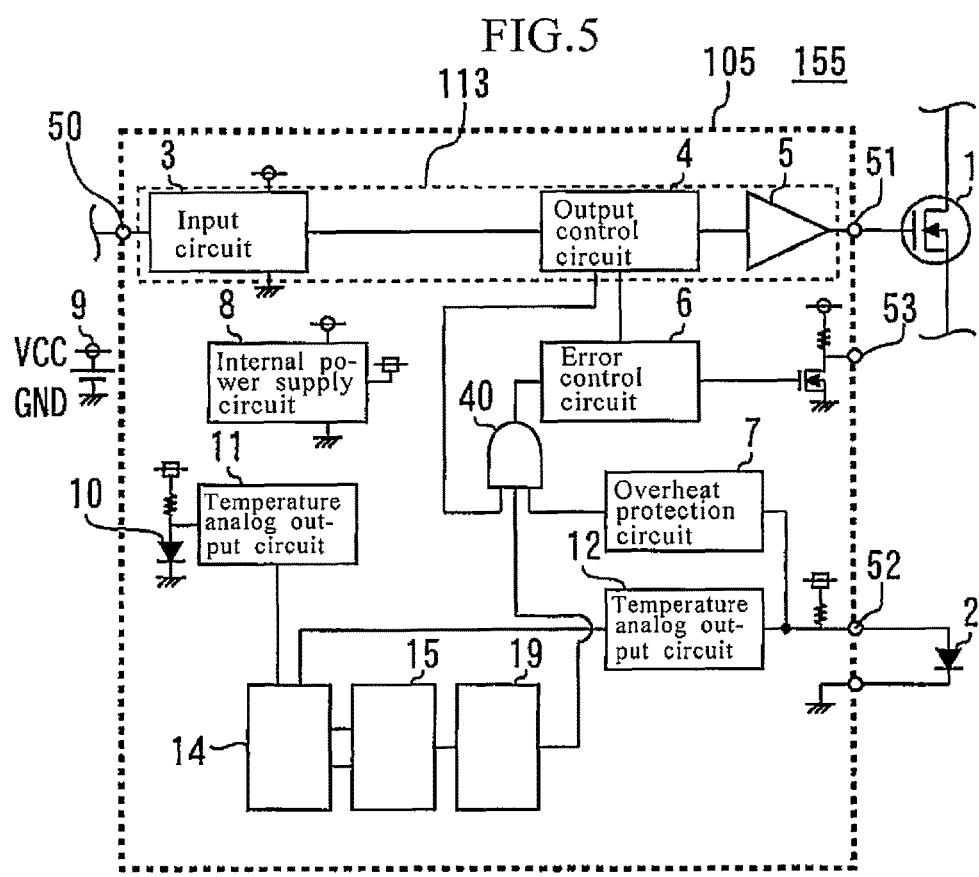
FIG. 5 is a circuit block diagram showing a semiconductor switching element driver circuit according to Embodiment 5 of the present invention.

FIG. 5 is a circuit block diagram showing a semiconductor switching element driver circuit according to Embodiment 5 of the present invention. A driver circuit 105 includes an identification circuit 19 in place of the comparator 16. The monitor output unit 17 and the allowable temperature difference setting circuit 18 are not connected. In other respects, the circuit configuration of the driver circuit 105 is the same as that of the driver circuit 104. The driver circuit 105 and the semiconductor switching element 1 constitute a semiconductor device 155 according to Embodiment 5. The driver circuit 105 also includes the signal circuit 113 constituted by the input circuit 3, the output control circuit 4 and the drive circuit 5, as in Embodiment 3.

As described above with respect to Embodiment 4, the temperature of the semiconductor switching element 1 and the temperature of the driver circuit 105 are converted into digital values by the AD conversion circuit 14, and the arithmetic circuit 15 obtains the temperature difference ΔT. The temperature difference ΔT computed by the arithmetic circuit 15 is input to the identification circuit 19.

The identification circuit 19 compares the value of the temperature difference ΔT with a comparative value stored therein. More specifically, a first comparative value $T_A$ and a second comparative value $T_B$ are set at the time of designing a cooling structure for the semiconductor device 155 to define a normal range $T_A \leq \Delta T \leq T_B$ of the temperature difference ΔT in the cooling structure design. If $0 < T_A < T_B$, an abnormality occurrence point can be determined, as described below. In Embodiment 5, a concrete numeric value of the temperature difference ΔT is a value obtained by subtracting the temperature of the driver circuit 105 from the element temperature of the semiconductor switching element 1.

(Abnormality 1) When ΔT<0, there is a probability of, for example, abnormal heat generation in the driver circuit 105 or the occurrence of short circuit at the output stage of the drive circuit 5.

(Abnormality 2) When $0 \leq \Delta T < T_A$, there is a probability of an abnormality in the cooling structure for the semiconductor device 155.

(Abnormality 3) When $T_B < \Delta T$, there is a probability of, for example, abnormal heat generation in the semiconductor switching element 1 or the occurrence of short circuit between the drain and the source of the semiconductor switching element 1.

When $T_B < \Delta T$ in a case where an IGBT or a bipolar transistor is used as the semiconductor switching element 1, there is a probability of, for example, short circuit between the collector and the emitter.

The identification circuit 19 outputs a plurality of kinds of error signals for discrimination of abnormality occurrence points, which are set in advance with respect to the magnitude of the temperature difference ΔT. Each error signal is input to the error control circuit 6 through the AND circuit 40.

The identification circuit 19 is designed to be capable of outputting at least three different kinds of error signals. These three kinds of error signals are respectively assigned to the above-described abnormalities 1 to 3. In the present embodiment, it is assumed that the identification circuit 19 outputs three kinds of error signals differing in duty ratio; each error signal is input to the error control circuit 6; and the error control circuit 6 outputs three kinds of error signals differing in duty ratio to the error signal terminal 53. A user can identify abnormalities 1 to 3 through the error signal terminal 53.

In Embodiment 5, as described above, an abnormality occurrence point in the semiconductor device 155 can be detected on the basis of the temperature difference ΔT between the semiconductor switching element 1 and the driver circuit 105.

Embodiment 6

Figure 6:
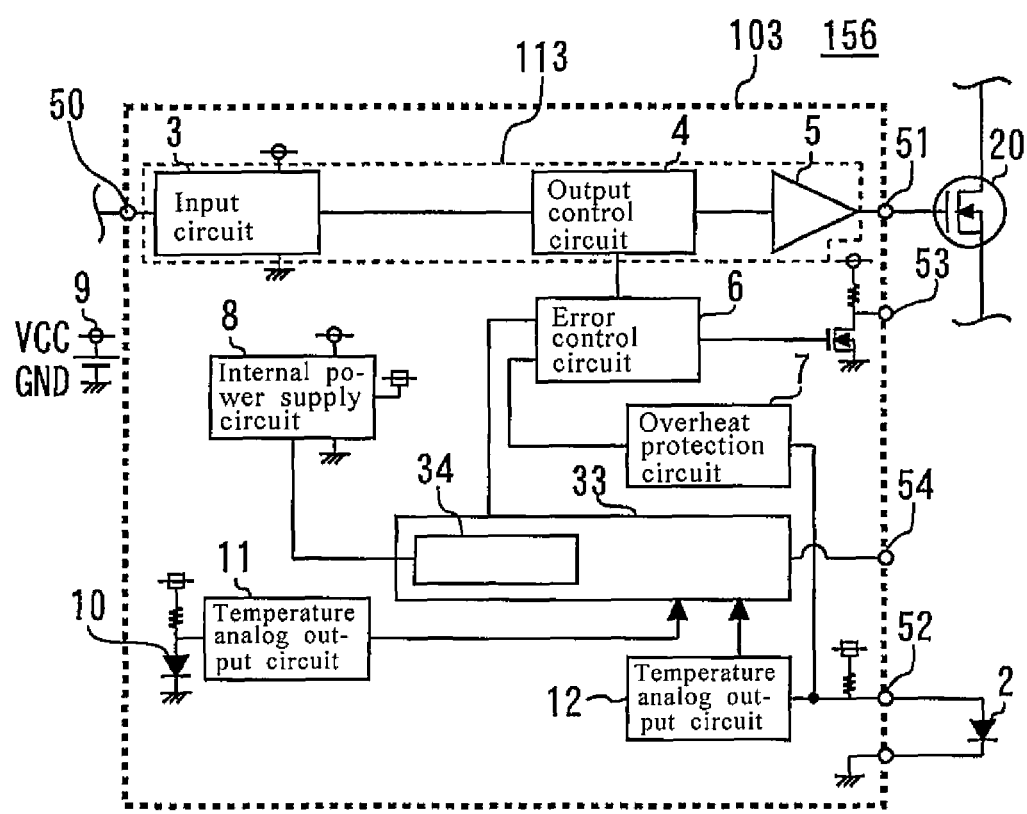
FIG. 6 is a circuit block diagram showing a semiconductor switching element driver circuit and a semiconductor device including the driver circuit according to Embodiment 6 of the present invention.

FIG. 6 is a circuit block diagram showing a semiconductor switching element driver circuit 103 and a semiconductor device 156 including the driver circuit 103 according to Embodiment 6 of the present invention. The semiconductor device 156 differs from Embodiment 3 in that a semiconductor switching element 20 is provided. The driver circuit 103 for driving the semiconductor switching element 20 is the same as that in Embodiment 3.

The semiconductor switching element 20 is a switching element using SiC (silicon carbide) as a semiconductor material. SiC devices using SiC as a semiconductor material have excellent electrical and thermal characteristics.

In Embodiment 6, the semiconductor switching element 20 is connected to the driver circuit 103. However, the present invention is not limited to this. A semiconductor device in which the semiconductor switching element 20 is connected to one of the driver circuits 101, 102, 104, and 105 may alternatively be provided.

Various semiconductor materials and element structures for the semiconductor switching element 1 are applicable. For example, an IGBT formed of silicon or a power MOSFET formed of silicon may be used.

A combination of any two or more of technical features of the driver circuits 101 to 115 and the semiconductor devices 151 to 156 according to Embodiments 1 to 6 described above may be made. More specifically, any two or more of a group of components A to F shown below may be selected and the selected two or more components may be provided in one driver circuit or one semiconductor device.

(Component A) Dead time adjustment circuit 13 according to Embodiment 1

(Component B) Driver circuit 25 according to Embodiment 2

(Component C) Short circuit protection circuit 33 and voltage dividing circuit 34 according to Embodiment 3

(Component D) AD conversion circuit 14, arithmetic circuit 15, comparator 16, monitor output unit 17, allowable temperature difference setting circuit 18, and AND circuit 40 according to Embodiment 4

(Component E) Identification circuit 19 according to Embodiment 5

(Component F) Semiconductor switching element 20 according to Embodiment 6

Description of Symbols 1,20 semiconductor switching element, 2 temperature sense diode, 3 input circuit, 4 output control circuit, 5,25 drive circuit, 6 error control circuit, 7 overheat protection circuit, 8 internal power supply circuit, 9 power supply terminal, 10 temperature sense diode, 11,12 temperature analog output circuit, 13 dead time adjustment circuit, 14 AD conversion circuit, 15 arithmetic circuit, 16 comparator, 17 monitor output unit, 18 allowable temperature difference setting circuit, 19 identification circuit, 33 short circuit protection circuit, 34 voltage dividing circuit, 40 AND circuit, 50 input terminal, 51 output terminal, 52 temperature detection terminal, 53 error signal terminal, 54 short circuit protection terminal, 101,102,103,104,105 driver circuit, 111, 112,113 signal circuit, 151,152,153,154,155,156 semiconductor device

The invention claimed is:

1. A semiconductor switching element driver circuit comprising:
   an input terminal to which an input signal is input;
   an output terminal connected to a control terminal of a semiconductor switching element;
   a signal circuit section which produces a drive signal from the input signal and supplies the drive signal to the output terminal;
   a temperature detector including both a first temperature detector which outputs a first temperature detection signal having correlation with the temperature of the signal circuit section, and a second temperature detector which receives a second temperature detection signal from an element temperature sensor element which senses the temperature of the semiconductor switching element; and an error control circuit that receives the second temperature detection signal, wherein the signal circuit section includes a drive circuit which supplies a current to the control terminal of the semiconductor switching element, the drive circuit changes drive current capability on the basis of both of the first temperature detection signal and the second temperature detection signal, and the error control circuit changes drive capability independent of the first temperature detection signal.

2. The semiconductor switching element driver circuit according to claim 1, wherein the drive circuit includes a plurality of output stage transistors; the plurality of output stage transistors are connected in parallel so that a plurality of current paths are formed in parallel with each other; and the drive circuit changes, on the basis of both of the first temperature detection signal and the second temperature detection signal, the number of output stage transistors to be turned on.

3. A semiconductor switching element driver circuit comprising:

an input terminal to which an input signal is input;

an output terminal connected to a control terminal of a semiconductor switching element;

a signal circuit section which produces a drive signal from the input signal and supplies the drive signal to the output terminal;

a temperature detector including both a first temperature detector which outputs a first temperature detection signal having correlation with the temperature of the signal circuit section, and a second temperature detector which receives a second temperature detection signal from an element temperature sensor element which senses the temperature of the semiconductor switching element;

a short circuit protection terminal; and a short circuit protection circuit which transmits a stop signal to the signal circuit section when a voltage input to the short circuit protection terminal reaches a threshold value, and which sets the threshold value on the basis of both of the first temperature detection signal and the second temperature detection signal.

4. A semiconductor switching element driver circuit comprising:

an input terminal to which an input signal is input;

an output terminal connected to a control terminal of a semiconductor switching element;

a signal circuit section including an output control section, which produces a drive signal from the input signal and supplies the drive signal to the output terminal;

a temperature detection circuit which outputs a first temperature detection signal having correlation with the temperature of the signal circuit section;

a temperature detection terminal which receives a second temperature detection signal from a temperature sensor element for the semiconductor switching element; and an error signal generation circuit which outputs an error signal on the basis of an output signal from the output control section and the difference between a temperature indicated by the first temperature detection signal and a temperature indicated by the second temperature detection signal.

5. The semiconductor switching element driver circuit according to claim 4, wherein the error signal generation circuit switches among a plurality of error signals different from each other according to the value of the difference between the temperatures.

* * * * *